(12) United States Patent
Fan et al.

(10) Patent No.: US 11,664,218 B2
(45) Date of Patent: May 30, 2023

(54) SEMICONDUCTOR DEVICE AND METHOD

(71) Applicants: National Taiwan University, Taipei (TW); Taiwan Semiconductor Manufacturing Co., Ltd., Hsinchu (TW)

(72) Inventors: Sheng-Ting Fan, Taipei (TW); Pin-Shiang Chen, Taipei (TW); Chee Wee Liu, Taipei (TW); Chi-Wen Liu, Hsinchu (TW)

(73) Assignees: TAIWAN SEMICONDUCTOR MANUFACTURING COMPANY, LTD., Hsin-chu (TW); NATIONAL TAIWAN UNIVERSITY, Taipei (TW)

( * ) Notice: Subject to any disclaimer, the term of this patent is extended or adjusted under 35 U.S.C. 154(b) by 68 days.

(21) Appl. No.: 17/340,275

(22) Filed: Jun. 7, 2021

(65) Prior Publication Data
US 2021/0296112 A1 Sep. 23, 2021

Related U.S. Application Data

(60) Continuation of application No. 16/848,356, filed on Apr. 14, 2020, now Pat. No. 11,043,376, which is a
(Continued)

(51) Int. Cl.
*H01L 21/00* (2006.01)
*H01L 21/02* (2006.01)
(Continued)

(52) U.S. Cl.
CPC .......... *H01L 21/0228* (2013.01); *H01L 29/24* (2013.01); *H01L 29/66621* (2013.01);
(Continued)

(58) Field of Classification Search
CPC ........................... H01L 21/0228; H01L 29/24; H01L 29/66621
See application file for complete search history.

(56) References Cited

U.S. PATENT DOCUMENTS 4,845,515 A * 7/1989 Suh .......................... G11B 7/24
5,963,817 A * 10/1999 Chu .................. H01L 21/76264
438/410

(Continued)

FOREIGN PATENT DOCUMENTS

CN 103238101 A * 8/2013 ............. H01F 1/401
CN 103531618 A * 1/2014 ....... H01L 29/66484
(Continued)

OTHER PUBLICATIONS

Ansari, et al., "A Proposed Confinement Modulated Gap Nanowire Transistor Based on a Metal (Tin)," Nano Lett. 2012, 12, Received Nov. 11, 2011, Published Apr. 13, 2012, pp. 2222-2227, ACS Publications.
(Continued)

*Primary Examiner* — Laura M Menz
(74) *Attorney, Agent, or Firm* — Slater Matsil, LLP

(57) ABSTRACT

A transistor based on topological insulators is provided. In an embodiment a topological insulator is used to form both the channel as well as the source/drain regions, wherein the channel has a first thickness such that the topological insulator material has properties of a semiconductor material and the source/drain regions have a second thickness such that the topological insulator has properties of a conductive material.

20 Claims, 10 Drawing Sheets

Related U.S. Application Data division of application No. 16/050,800, filed on Jul. 31, 2018, now Pat. No. 10,636,651, which is a division of application No. 15/151,100, filed on May 10, 2016, now Pat. No. 10,109,477.

(60) Provisional application No. 62/273,628, filed on Dec. 31, 2015.

(51) Int. Cl.

| | | |
|---|---|---|
| *H01L 29/24* | (2006.01) | |
| *H01L 29/78* | (2006.01) | |
| *H01L 29/66* | (2006.01) | |
| *H01L 29/786* | (2006.01) | |

(52) U.S. Cl.
CPC ........ *H01L 29/66628* (2013.01); *H01L 29/78* (2013.01); *H01L 29/78681* (2013.01); *H01L 29/78696* (2013.01); *H01L 21/02568* (2013.01)

(56) References Cited

U.S. PATENT DOCUMENTS

| | | | |
|---|---|---|---|
| 6,246,091 B1 * | 6/2001 | Rodder | H01L 29/0847 |
| | | | 257/E21.205 |
| 6,511,867 B2 | 1/2003 | Lowrey et al. | |
| 6,579,780 B2 * | 6/2003 | Takahashi | H01L 21/02389 |
| | | | 438/479 |
| 6,882,051 B2 | 4/2005 | Majumdar et al. | |
| 9,024,415 B2 * | 5/2015 | Zhang | H01L 31/08 |
| | | | 257/629 |
| 9,425,324 B2 | 8/2016 | Diaz et al. | |
| 9,490,430 B1 * | 11/2016 | Chen | H01L 29/4908 |
| 9,543,387 B2 * | 1/2017 | Chang | H01L 29/0847 |
| 10,109,477 B2 * | 10/2018 | Fan | H01L 29/78696 |
| 10,636,651 B2 * | 4/2020 | Fan | H01L 21/0228 |
| 10,748,774 B2 * | 8/2020 | Hong | H01L 29/517 |
| 11,043,376 B2 * | 6/2021 | Fan | H01L 21/0228 |
| 11,114,301 B2 * | 9/2021 | Hong | H01L 29/775 |
| 2001/0006840 A1 * | 7/2001 | Takahashi | C30B 29/42 |
| | | | 438/93 |
| 2006/0138569 A1 * | 6/2006 | Cho | H01L 29/66916 |
| | | | 257/E29.05 |
| 2006/0172480 A1 * | 8/2006 | Wang | H01L 21/823842 |
| | | | 438/585 |
| 2008/0179636 A1 * | 7/2008 | Chidambarrao | H01L 29/1054 |
| | | | 438/150 |
| 2012/0138887 A1 * | 6/2012 | Zhang | H01F 1/401 |
| | | | 257/E29.005 |
| 2012/0273763 A1 * | 11/2012 | Banerjee | H01L 49/003 |
| | | | 257/E29.168 |
| 2013/0277714 A1 * | 10/2013 | Le | H01L 29/785 |
| | | | 257/190 |
| 2014/0084239 A1 * | 3/2014 | Radosavljevic | H01L 29/068 |
| | | | 257/E29.081 |
| 2015/0206946 A1 * | 7/2015 | Chen | H01L 29/0847 |
| | | | 438/300 |
| 2015/0255578 A1 * | 9/2015 | Chang | H01L 29/7848 |
| | | | 438/300 |
| 2015/0372142 A1 * | 12/2015 | Kuang | H01L 29/66636 |
| | | | 438/300 |
| 2016/0163850 A1 * | 6/2016 | Liu | H01L 29/41758 |
| | | | 257/338 |
| 2016/0351709 A1 * | 12/2016 | Nishikawa | H01L 27/11293 |
| 2016/0372607 A1 * | 12/2016 | Le | H01L 29/42364 |
| 2017/0194470 A1 * | 7/2017 | Fan | H01L 29/66628 |
| 2018/0337032 A1 * | 11/2018 | Fan | H01L 29/78 |
| 2019/0164767 A1 * | 5/2019 | Hong | H01L 21/02178 |
| 2020/0243327 A1 * | 7/2020 | Fan | H01L 29/24 |
| 2020/0365407 A1 * | 11/2020 | Hong | H01L 29/513 |
| 2021/0296112 A1 * | 9/2021 | Fan | H01L 21/0228 |

FOREIGN PATENT DOCUMENTS

| | | | | | |
|---|---|---|---|---|---|
| CN | 104425269 A | * | 3/2015 | | |
| CN | 105470303 A | | 4/2016 | | |
| CN | 104425269 B | * | 7/2017 | | |
| CN | 107039280 B | * | 5/2020 | ........ | H01L 21/0228 |
| CN | 106605303 B | * | 12/2020 | ........ | H01L 29/0669 |
| CN | 107768426 B | * | 6/2021 | ............ | B82Y 10/00 |
| CN | 113380628 A | * | 9/2021 | ....... | H01L 29/66431 |
| DE | 102020116005 A1 | * | 12/2021 | ....... | H01L 29/66431 |
| TW | 201735128 A | * | 10/2017 | ........ | H01L 21/0228 |
| WO | WO-2012078774 A1 | * | 6/2012 | ............ | H01F 1/401 |
| WO | WO-2016048377 A1 | * | 3/2016 | ........ | H01L 29/0669 |

OTHER PUBLICATIONS

Qian et al., "Quantum Spin Hall Effect in Two-Dimensional Transition Metal Dichalcogenides," Science, vol. 346, Issue 6215, Dec. 12, 2014, downloaded from http://sciencemag.org/ on May 2, 2016, 25 pages.

* cited by examiner

SEMICONDUCTOR DEVICE AND METHOD

PRIORITY CLAIM AND CROSS-REFERENCE

This application is a continuation of U.S. patent application Ser. No. 16/848,356, filed on Apr. 14, 2020, entitled "Semiconductor Device and Method," which is a division of U.S. patent application Ser. No. 16/050,800, filed on Jul. 31, 2018, entitled "Semiconductor Device and Method," now U.S. Pat. No. 10,636,651 issued on Apr. 28, 2020, which is a division of U.S. patent application Ser. No. 15/151,100, filed on May 10, 2016, entitled "Semiconductor Device and Method," now U.S. Pat. No. 10,109,477 issued on Oct. 23, 2018, which application claims priority to and the benefit of U.S. Provisional Application No. 62/273,628, filed on Dec. 31, 2015, entitled "Tunable Gap Ultra-Thin-Body Transistor Based on a Topological Insulator," which applications are hereby incorporated herein by reference in their entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. Improvements in transistor designs are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
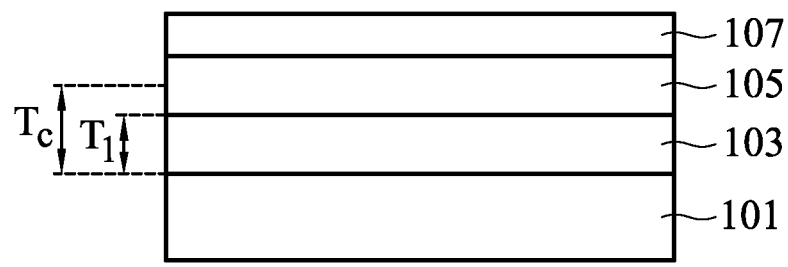
FIG. 1 illustrates a formation of a channel layer, a gate dielectric layer, and a gate electrode layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a tunable gap ultra-thin body transistor which is based on a topological insulator. However, the embodiments described herein may be applied in any suitable application.

With reference now to FIG. 1, there is illustrated a substrate 101, a first channel layer 103, a first gate dielectric layer 105, and a first gate electrode layer 107. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include sapphire, multi-layered substrates, gradient substrates, or hybrid orientation substrates. Any suitable substrate may be utilized.

The first channel layer 103 may be formed over the substrate 101 and will be used to form a first channel 305 (not illustrated in FIG. 1 but illustrated and discussed below with respect to FIG. 3) for a single-gate transistor 400 (also not illustrated in FIG. 1 as being completed but illustrated and described below with respect to FIG. 4A). In an embodiment the first channel layer 103 may be a topological insulator material wherein the material has a bulk structure with an insulating or semiconducting (gapped) structure as well as conducting (gapless) edges or surfaces due to non-trivial topology of a band structure caused by interactions between spin and orbital degrees of freedom. In particular embodiments in which the first channel layer 103 is a topological insulating material, the first channel layer 103 may be a material such as $Bi_2Se_3$, $Bi_2Te_3$, $Sb_2Te_3$, or tetradymite-like ternary compounds with a structure such as $M_2X_2Y$ such as $Bi_2Te_2Se$, $Bi_2Te_2S$, $Bi_2Se_2S$, $Sb_2Te_2Se$, $Sb_2Te_2S$, or the like. However, any suitable topological insulator may be utilized.

Additionally, with respect to the materials utilized for the first channel layer 103, the material of the first channel layer 103 will have a critical thickness $T_c$, wherein the thickness of the material of the first channel layer 103 will determine the properties of the material of the first channel layer 103 and the properties of the material for the first channel layer 103 will change as the thickness of the material for the first channel layer 103 changes. For example, in a particular embodiment in which $Bi_2Se_3$ is utilized as the material for the first channel layer 103, the $Bi_2Se_3$ will have a critical thickness of six quintuple layers (e.g., layers of Se—Bi—Se—Bi—Se), below which the $Bi_2Se_3$ will have properties of a semiconductor material and above which the $Bi_2Se_3$ will have properties of a topological insulator which has bulk insulator properties along with conductive surface states.

Figure 2A:
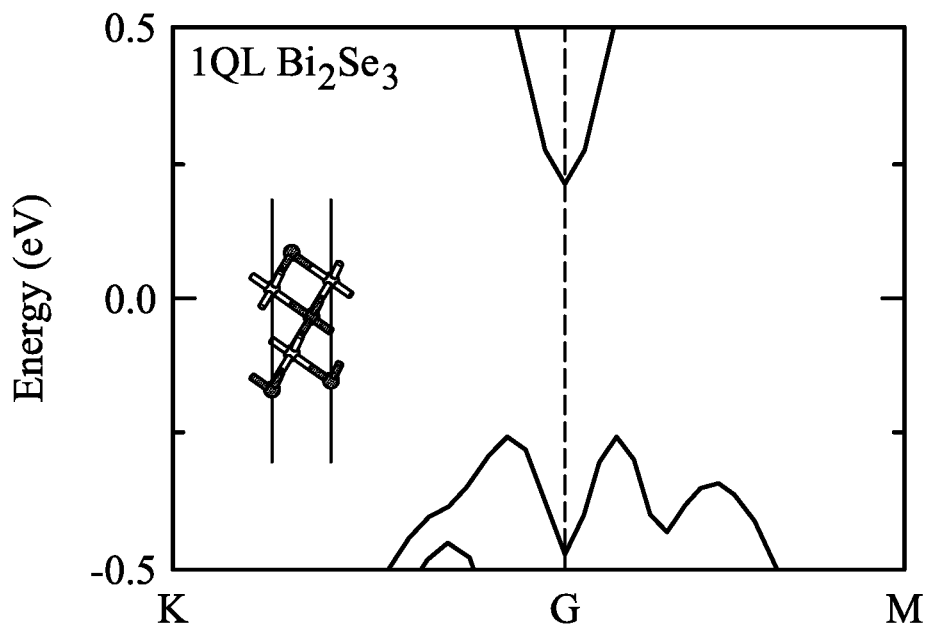
FIGS. 2A-2C illustrate band gaps of topological insulators in accordance with some embodiments.
Figure 2B:
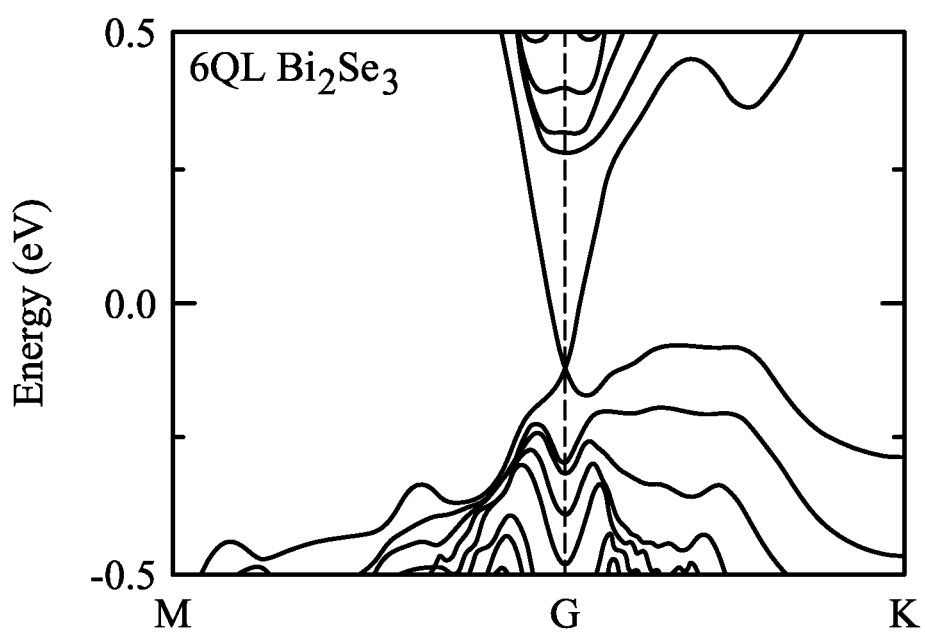

FIG. 2A helps to illustrate this change and separation of properties based upon thicknesses. When the thickness of a $Bi_2Se_3$ film is reduced to several nanometres, the surface-state wavefunctions from the two surfaces of $Bi_2Se_3$ film are interfered and overlapped. Therefore, a gap opens and no surface state exists. As illustrated in FIG. 2A, a single quintuple layer (1QL) of $Bi_2Se_3$ has an energy band gap that does not allow for the conduction of electricity and causes the $Bi_2Se_3$ to have the properties of a semiconductor material. However, as illustrated in FIG. 2B, as the number of layers of $Bi_2Se_3$ increases, the surface states can very well exist when the critical thickness of $Bi_2Se_3$ has been reached (which for $Bi_2Se_3$ is about 6 quintuple layers), the band gap is bridged, and the $Bi_2Se_3$ will have the properties of a topological insulator, such that the material is an insulator but which has conductive surface states such that electricity will flow along the surface of the topological insulator. As such, the thickness of the material utilized for the first channel layer 103 determines its properties, and control of this thickness will also control the properties that are obtained from the formation of the first channel layer 103.

Figure 2C:
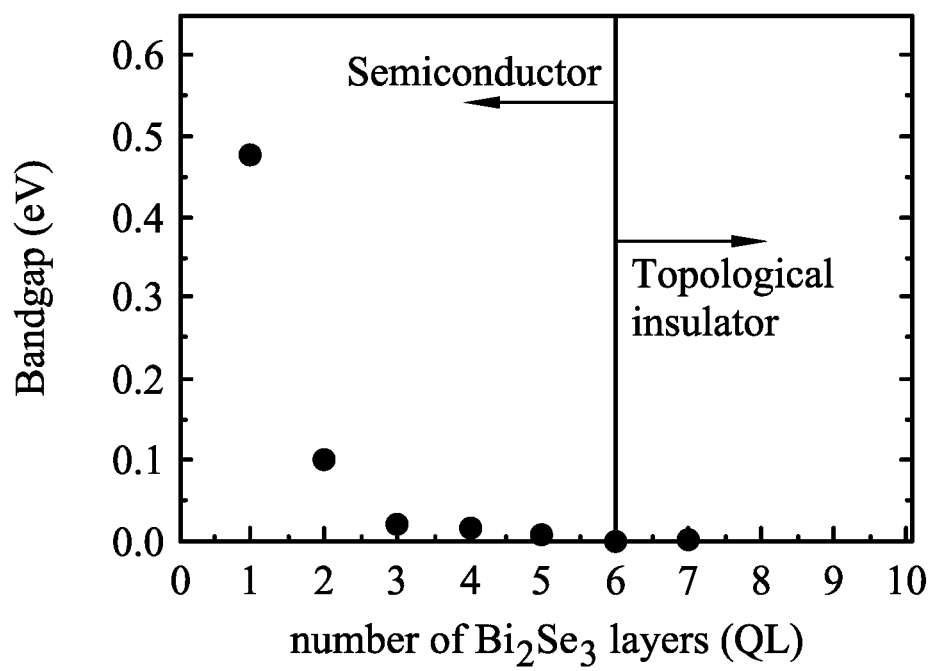

FIG. 2C helps to illustrate this change in properties based upon the thickness of the material of the first channel layer 103 in another fashion. In particular, FIG. 2C illustrates the bandgap of each number of quintuple layers from 1 quintuple layer of $Bi_2Se_3$ to 7 quintuple layers of $Bi_2Se_3$ and illustrates that at 6 quintuple layers the bandgap reaches zero and the $Bi_2Se_3$ has the properties of a topological insulator with metallic surface states that allows for the flow of electricity. However, below 6 quintuple layers, there is a non-zero bandgap which causes the $Bi_2Se_3$ to have the properties of a semiconductor material.

In order to function appropriately as the first channel 305, the first channel layer 103 is formed to have a first thickness $T_1$ that is below the critical thickness $T_c$ (shown in relative located in FIG. 1) of the material used for the first channel layer 103. In a particular embodiment in which the first channel layer 103 is $Bi_2Se_3$, $Bi_2Te_3$, or $Sb_2Te_3$, the first channel layer 103 is formed to have a thickness of less than 6 quintuple layers, such as having a thickness of 1 quintuple layer, or about 1 nm. However, any suitable thickness may be utilized depending upon the properties of the topological insulator material being utilized. By forming the first channel layer 103 to have the first thickness $T_1$ below the critical thickness $T_c$ of the material chosen for the first channel layer 103, the first channel layer 103 will have a material with semiconductor properties and not conductive properties.

The first channel layer 103 may be formed using a process such as an epitaxial growth process. In a particular embodiment in which the first channel layer 103 is formed from a material such as $Bi_2Se_3$, the epitaxial growth process may proceed at a temperature of between about 100° C. and about 500° C., and at a pressure less than about $2.0 \times 10^{-9}$ Torr, using any suitable source or sources for bismuth and selenium, such as evaporated high-purity Bi (99.99%) and Se (99.99%). However, any suitable growth or deposition process, such as an atomic layer deposition process or the like, may also be used.

Additionally, the epitaxial growth process may be continued for a time that is sufficient to grow the first channel layer 103 to the first thickness $T_1$ without growing the first channel layer 103 to a thickness greater than the critical thickness $T_c$. In an embodiment in which the deposition rate of $Bi_2Se_3$ films is about 0.67 angstrom/min, the epitaxial growth process may be performed for a first time of between about 70 sec and about 270 sec. However, any suitable time may be utilized.

Once the first channel layer 103 has been formed, a first gate dielectric layer 105 and a first gate electrode layer 107 may be formed over the first channel layer 103. The first gate dielectric layer 105 may be formed from a high permittivity (high-k) material (e.g., with a relative permittivity greater than about 5) such as aluminum oxide ($Al_2O_3$), hafnium oxide ($HfO_2$), hafnium oxynitride (HfON), lanthanum oxide ($La_2O_3$), or zirconium oxide ($ZrO_2$), or combinations thereof, with an equivalent oxide thickness of about 0.5 nm to about 2 nm. Additionally, any combination of silicon dioxide, silicon oxynitride, and/or high-k materials may also be used for the first gate dielectric layer 105. The first gate dielectric layer 105 may be formed using a process such as atomic layer deposition, chemical vapor deposition, sputtering, or the like.

The first gate electrode layer 107 may comprise a conductive material and may be selected from a group comprising of gold, titanium, platinum, aluminum, polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of other metals that may be used include tantalum, tungsten, copper, molybdenum, nickel, etc. Any suitable material may be used to form the first gate electrode layer 107.

The first gate electrode layer 107 may be deposited by sputter deposition, chemical vapor deposition (CVD), or other techniques known and used in the art for depositing conductive materials. The thickness of the first gate electrode layer 107 may be in the range of about 200 angstroms to about 4,000 angstroms. Dopants may or may not be introduced into the first gate electrode layer 107 at this point. Dopants may be introduced, for example, by molecular doping techniques thru charge transfer.

Figure 3:
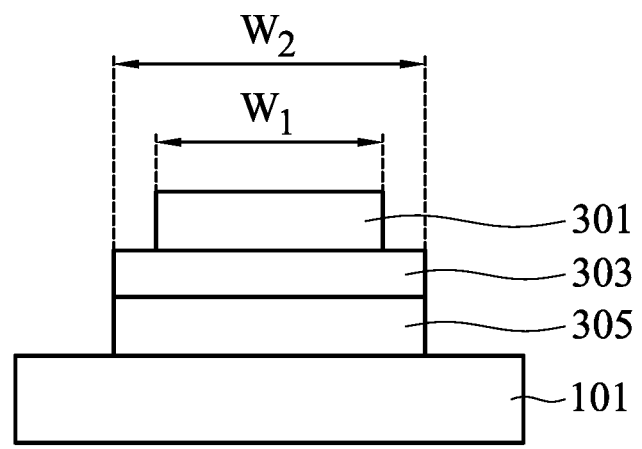
FIG. 3 illustrates a patterning of the channel layer, the gate dielectric layer, and the gate electrode layer in accordance with some embodiments.

FIG. 3 illustrates that, once the first gate electrode layer 107 has been formed, the first gate electrode layer 107 may be patterned to form a first gate electrode 301. The first gate electrode 301 may be formed by depositing and patterning a first gate mask (not illustrated in FIG. 3) on the first gate electrode layer 107 using, for example, deposition and photolithography techniques known in the art. The first gate mask may incorporate commonly used masking materials, such as (but not limited to) photoresist material, silicon oxide, silicon oxynitride, and/or silicon nitride. Once the first gate mask has been placed, the first gate electrode layer 107 may be etched using plasma etching to form the first gate electrode 301. In an embodiment the first gate electrode layer 107 may be patterned to have a first width $W_1$ of between about 7 nm and about 100 µm.

FIG. 3 also illustrates a patterning of the first gate dielectric layer 105 and the first channel layer 103. In an embodiment the patterning of the first gate dielectric layer

105 and the first channel layer 103 may be initiated by removing the first gate mask using, e.g., an ashing or other removal process, and a second gate mask may be deposited and patterned. In an embodiment the second gate mask may be deposited and patterned using, for example, deposition and photolithography techniques known in the art. The second gate mask may incorporate commonly used masking materials, such as (but not limited to) photoresist material, silicon oxide, silicon oxynitride, and/or silicon nitride. Once the second gate mask has been placed, the first gate dielectric layer 105 and the first channel layer 103 may be etched using plasma etching to form the first gate dielectric 303 and the first channel 305. In an embodiment the first gate dielectric 303 and the first channel 305 may be patterned to have a second width $W_2$ of between about 7 nm and about 100 μm.

Figure 4A:
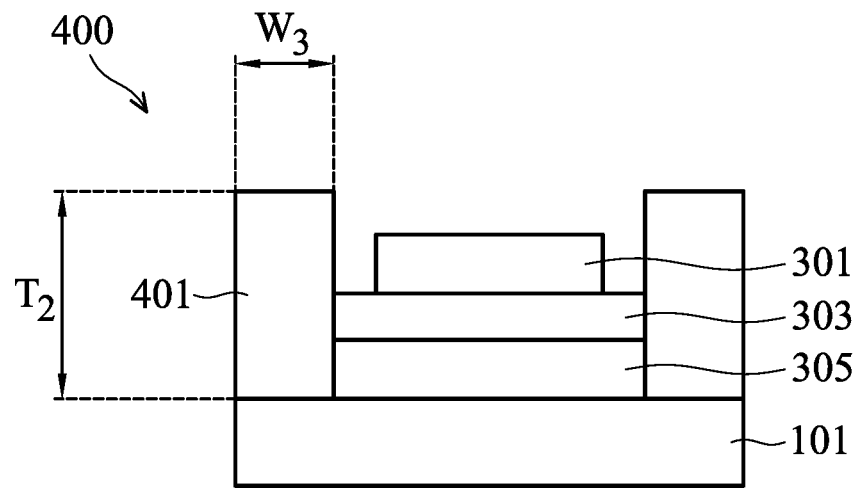
FIGS. 4A-4B illustrate a formation of source/drain regions in accordance with some embodiments.
Figure 4B:
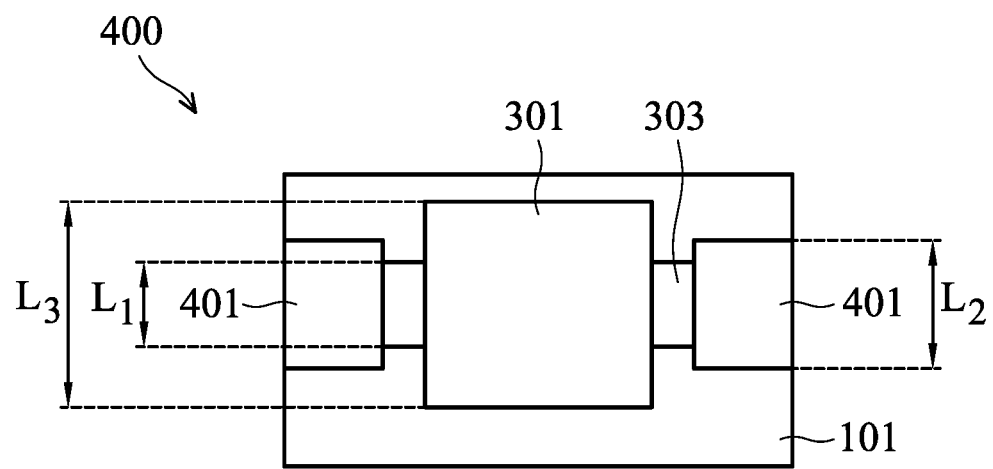

FIGS. 4A-4B illustrate a formation of source/drain regions 401 in contact with the first channel 305. In an embodiment the source/drain regions 401 comprises a material with a critical thickness $T_c$ as described herein, wherein the properties of the material used for the source/drain regions 401 are dependent at least in part upon the thickness of the material. In some embodiments the material of the source/drain regions 401 is a topological insulator and, in particular embodiments, is the same topological insulator material as the first channel 305. For example, in an embodiment in which the first channel 305 is $Bi_2Se_3$, the source/drain regions 401 are also $Bi_2Se_3$, although any suitable material may be used.

However, while the first channel 305 is formed using a topological insulator with a thickness that keeps the properties of the topological insulator as a semiconductor material (e.g., below 6 quintuple layers for $Bi_2Se_3$, such as 1 quintuple layer), the source/drain regions 401 are formed using a topological insulator material with a second thickness $T_2$ that is greater than the critical thickness $T_c$ of the material. By forming the material of the source/drain regions 401 to have the second thickness $T_2$ greater than the critical thickness $T_c$, the material of the source/drain regions 401 will have different properties than the material of the first channel 205, such as by having the properties of a topological insulator with bulk insulating properties as well as having surfaces with metallic behavior that allows for the conduction of electricity along the surface. In particular embodiments in which $Bi_2Se_3$, $Bi_2Te_3$, or $Sb_2Te_3$ are utilized for the source/drain regions 401, the source/drain regions 401 may be formed with the second thickness $T_2$ of six quintuple layers or greater, such as about 6 nm or greater. The source/drain regions 401 may be formed to have a third width $W_3$ of between about 7 nm and about 100 μm.

In an embodiment the source/drain regions 401 may be formed from similar materials and using similar processes as the first channel layer 103 (described above with respect to FIG. 1). For example, the source/drain regions 401 may be formed using a process such as molecular beam epitaxial growth. However, for the process of forming the source/drain regions 401, instead of continuing the process for the first time of between about 70 sec and about 270 sec, which would result in the first thickness $T_1$ below the critical thickness $T_c$, the epitaxial growth process for the source/drain regions 401 is continued for a second time of between about 6 min and about 120 min, such that the source/drain regions 401 have the second thickness $T_2$ greater than the critical thickness $T_c$. However, any suitable process may be utilized to form the source/drain regions 401.

FIG. 4B illustrates a top-down view of the single-gate transistor 400. As can be seen, the first gate dielectric 303 may be formed to have a first length $L_1$ of between about 7 nm and about 100 μm. Additionally, the source/drain regions 401 may be formed to have a second length $L_2$ of between about 7 nm and about 100 μm. The first gate electrode 301 may be formed to have a third length $L_3$ of between about 7 nm and about 100 μm. However, any suitable dimensions may be utilized.

By forming the first channel 305 to have the first thickness $T_1$ such that the first channel 305 has the properties of a semiconductor material and by also forming the source/drain regions 401 to have the second thickness $T_2$ such that the source/drain regions 401 have the properties of a topological insulator with a conductive surface, the same material (e.g., $Bi_2Se_3$) can be used for both the first channel 305 as well as the source/drain regions 401 such that there is no lattice mismatch between the first channel 305 and the source/drain regions 401. As such, the overall process may be simplified while taking advantage of the properties of the topological insulators in the formation of transistors. For example, by forming the single-gate transistor 400 with the first channel 305 and the source/drain regions 401 as described above, a normally-off topological insulator based transistor with a low contact resistance may be obtained. Additionally, because materials such as $Bi_2Se_3$ have a layered crystal structure consisting of stacked Se—Bi—Se—Bi—Se quintuple layers (QLs), and since the channel thickness in some embodiments is nearly 1 QL, the short channel effects in devices that utilized these embodiments is the same as FETs based on two-dimensional materials. In other words, short-channel effects can be suppressed by reducing the gate dielectric thickness, which enhances the electrostatic control from the gate.

Figure 5A:
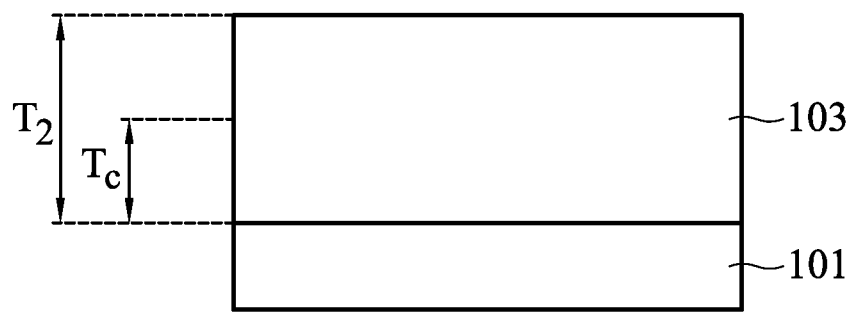
FIGS. 5A-5C illustrate a formation of the channel and source/drain regions in accordance with some embodiments.
Figure 5B:
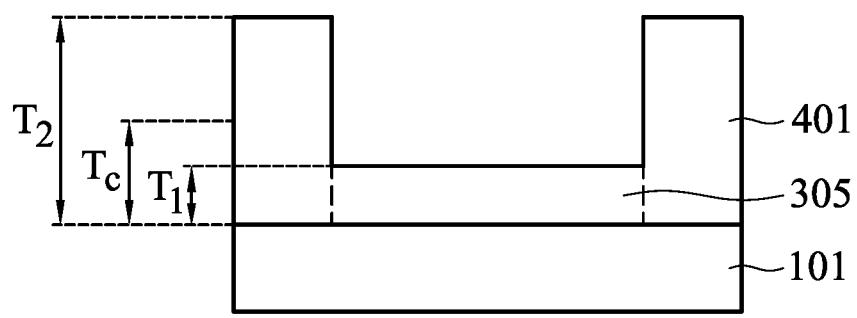
Figure 5C:
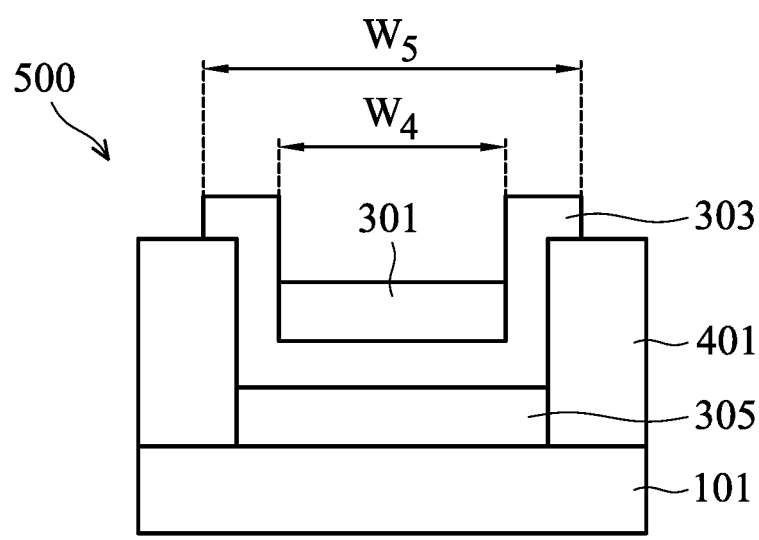

FIGS. 5A-5C illustrate an embodiment of a process that may be used to manufacture a second single-gate transistor 500 using, e.g., a topological insulator. In this embodiment the first channel layer 103 is formed on the substrate 101 as described above with respect to FIG. 1 (e.g., an epitaxial growth process). In this embodiment, however, the first channel layer 103 is initially grown to the second thickness $T_2$ which is larger than the critical thickness $T_c$ of the material chosen for the first channel layer 103. As such, the first channel layer 103 in this embodiment is initially formed with the properties of the topological insulator, with both the bulk insulator along with the conductive surface.

FIG. 5B illustrates that, once the first channel layer 103 has been grown to the second thickness $T_2$, the first channel 305 and the source/drain regions 401 are formed from the first channel layer 103 (with the separation between the first channel layer 103 and the source/drain regions 401 being illustrated by the dashed lines in FIG. 5B). In an embodiment the first channel 305 and the source/drain regions 401 are formed simultaneously from the first channel layer 103 (with the second thickness $T_2$) by patterning the first channel layer 103 and reducing the thickness of the first channel layer 103 until the first channel 305 has the first thickness $T_1$ below the critical thickness $T_c$ such that the first channel 305 has the properties of a semiconductor material.

The thickness of the first channel layer 103 may be reduced by initially placing a source/drain mask (not separately illustrated in FIG. 5B) over those portions of the first channel layer 103 that are desired to be formed into the source/drain regions 401. In an embodiment the source/drain mask may be deposited and patterned using, for example, deposition and photolithography techniques known in the art. The source/drain mask may incorporate commonly used masking materials, such as (but not limited to) photoresist material, silicon oxide, silicon oxynitride, and/or silicon nitride. Once the source/drain mask has been placed, the exposed portions of the first channel layer 103 may be etched using plasma etching to form the first channel 305 (with the thickness reduced to below the critical thickness $T_c$) and the source/drain regions 401 (without the thickness reduced to below the critical thickness $T_a$).

FIG. 5C illustrates that, once the first channel 305 and the source/drain regions 401 have been formed from the first channel layer 103, the first gate dielectric 303 and the first gate electrode 301 may be formed over the first channel 305. In an embodiment the first gate dielectric 303 may be formed as described above with respect to FIGS. 1 and 3. For example, the first gate dielectric layer 105 (not separately illustrated in FIG. 5C) may be formed by initially forming a layer of material such as aluminum oxide or hafnium oxide using a process such as atomic layer deposition, chemical vapor deposition, sputtering, or the like. By using a conformal deposition process such as atomic layer deposition, the first gate dielectric layer 105 will take on the shape of the underlying structures, forming a "U" shape between the source/drain regions 401 and over the first channel 205.

Once the first gate dielectric layer 105 has been deposited, the first gate electrode layer 107 (not separately illustrated in FIG. 5C) may be deposited over the first gate dielectric layer 105. In an embodiment the first gate electrode layer 107 may be formed as described above with respect to FIG. 1. For example, the first gate electrode layer 107 may be deposited by depositing a conductive material such as gold, titanium, platinum, or aluminum over the dielectric material using a process such as sputtering, although any other suitable material or method of manufacture may be utilized.

Once the first gate dielectric layer 105 and the first gate electrode layer 107 have been formed, the first gate dielectric layer 105 and the first gate electrode layer 107 may be patterned into the first gate dielectric 303 and the first gate electrode 301, respectively. In an embodiment the first gate dielectric layer 105 and the first gate electrode layer 107 may be patterned as described above with respect to FIG. 3, whereby one or more photoresists are deposited, exposed, developed, and then used as mask(s) in order to pattern the first gate dielectric layer 105 and the first gate electrode layer 107 into the desired shapes. In an embodiment the first gate electrode 301 may be patterned to a fourth width $W_4$ of between about 7 nm and about 100 μm, and the first gate dielectric 303 may be patterned to a fifth width $W_5$ of between about 7 nm and about 100 μm.

Figure 6A:
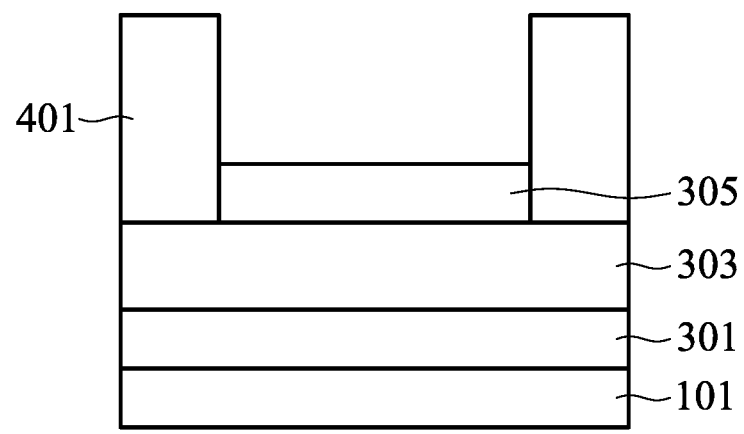
FIGS. 6A-6B illustrate a formation of the channel on the gate dielectric in accordance with some embodiments.

FIG. 6A illustrates another embodiment in which the first channel 305 and the source/drain regions 401 are formed over the first gate electrode 301 and the first gate dielectric 303. In this embodiment the first gate electrode 301 and the first gate dielectric 303 are initially formed prior to the formation of the first channel 305 and the source/drain regions 401. In an embodiment the first gate electrode 301 and the first gate dielectric 303 may be formed as described above with respect to FIGS. 1 and 3. For example, the first gate dielectric layer 105 and the first gate electrode layer 107 may be formed by initially forming a conductive material such as gold, titanium, platinum, or aluminum over the dielectric material using a process such as sputtering and then depositing a layer of material such as aluminum oxide, hafnium oxide, or silicon oxide using a process such as atomic layer deposition. Once the first gate dielectric layer 105 and the first gate electrode layer 107 have been formed, the first gate dielectric layer 105 and the first gate electrode layer 107 may be patterned, if desired, using a suitable photolithographic masking and etching process in order to form the first gate electrode 301 and the first gate dielectric 303. However, any suitable process for depositing the first gate electrode 301 and the first gate dielectric 303 may be utilized. However, in this embodiment the first gate dielectric layer 105, if desired, may be formed to a thickness of between about 50 nm to about 500 nm, although any suitable thickness may be utilized.

Once the first gate electrode 301 and the first gate dielectric 303 have been formed, the first channel 305 and the source/drain regions 401 may be formed over the first gate dielectric 303. In an embodiment the first channel 305 and the source/drain regions 401 may be formed as described above with respect to FIGS. 1-5B. For example, the first channel 205 and the source/drain regions 401 may be formed by initially growing the first channel layer 103 to the second thickness $T_2$ such that the material of the first channel layer 103 has the properties of a topological insulator (with metallic conducting surface states), and then reducing the thickness of a portion of the original first channel layer 103 to the first thickness $T_1$ in order to form the first channel 305 with properties of a semiconductor (as described above with respect to FIGS. 5A-5B). As such, the first gate dielectric 303 has a planar surface facing the first channel 305 and the source/drain region 401 is in physical contact that planar surface.

In another embodiment similar to the embodiment described above with respect to FIGS. 1-4B, the first channel layer 103 may be grown on the first gate dielectric 303 to the first thickness $T_1$ and without growing to a thickness greater than the critical thickness $T_c$. As such, the first channel layer 103 is formed to have properties of a semiconductor material. Once the first channel layer 103 has been grown to the first thickness $T_1$, the first channel layer 103 may be patterned into the first channel 305 by placing, exposing, and developing a photoresist (not separately illustrated in FIG. 6A) over the first channel layer 103 before using the photoresist as a mask during an etching process such as a dry etch to form the first channel 305.

In addition to forming the first channel 305, the etching process will also expose the underlying first gate dielectric 303. Once the underlying first gate dielectric 303 has been exposed, the source/drain regions 401 may be formed on opposite sides of the first channel 305 as described above with respect to FIG. 4A. For example, the source/drain regions 401 may be formed from the same material as the first channel 305 using an epitaxial growth process to epitaxially grow the source/drain regions 401 onto the first gate dielectric 303. Additionally, the source/drain regions 401, while being grown from the same material as the first channel 305, will grow the source/drain regions 401 to have the second thickness $T_2$ greater than the critical thickness $T_c$ such that the source/drain regions 401 will have the properties of a topological insulator with metallic surface states. For example, in an embodiment in which the source/drain regions 401 are $Bi_2Se_3$, the source/drain regions 401 will be grown to a thickness that is greater than six quintuple layers. However, any suitable thickness may be utilized. As such, the first gate dielectric 303 in this embodiment has a first planar surface facing the first channel 305 and a second planar surface perpendicular to the first planar surface, wherein the source/drain region 401 is in physical contact the second planar surface.

Figure 6B:
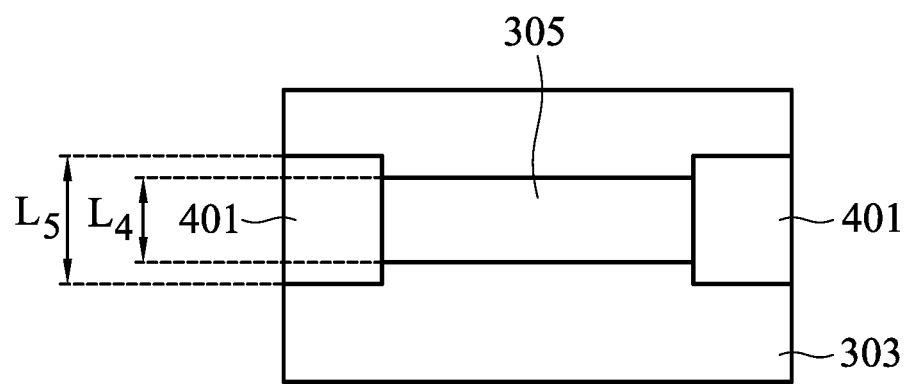

FIG. 6B illustrates a top-down view of the structure of FIG. 6A. In this view, it can be seen that the first channel 305 is over the first gate dielectric 303 and extends between the source/drain regions 401. In an embodiment the first channel 305 in this structure has a fourth length $L_4$ of between about 7 nm and about 100 μm, while the source/drain regions 401 have a fifth length $L_5$ of between about 7 nm and about 100 µm. However, any suitable dimensions may be utilized.

By forming the first channel 305 and the source/drain regions 401 over the first gate dielectric 303, additional flexibility in the manufacturing process may be obtained. Such flexibility allows manufacturers the ability to modify their processes to arrive at the most efficient use of resources, allowing for a more efficient process.

Figure 7:
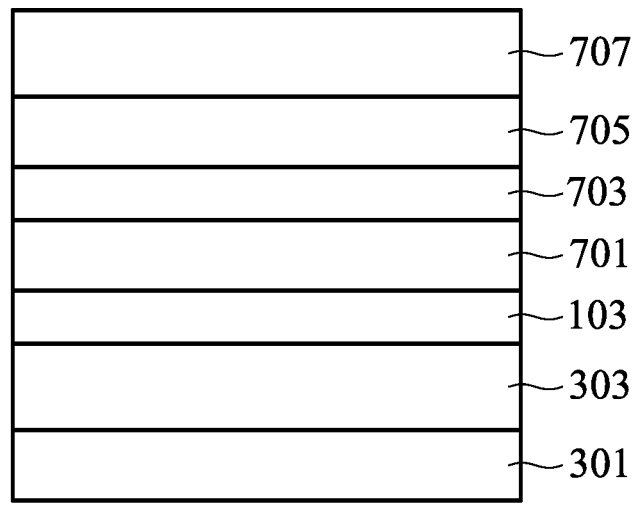
FIG. 7 illustrates a formation of a second channel layer, a second gate dielectric layer, and a second gate electrode in accordance with some embodiments.
Figure 8A:
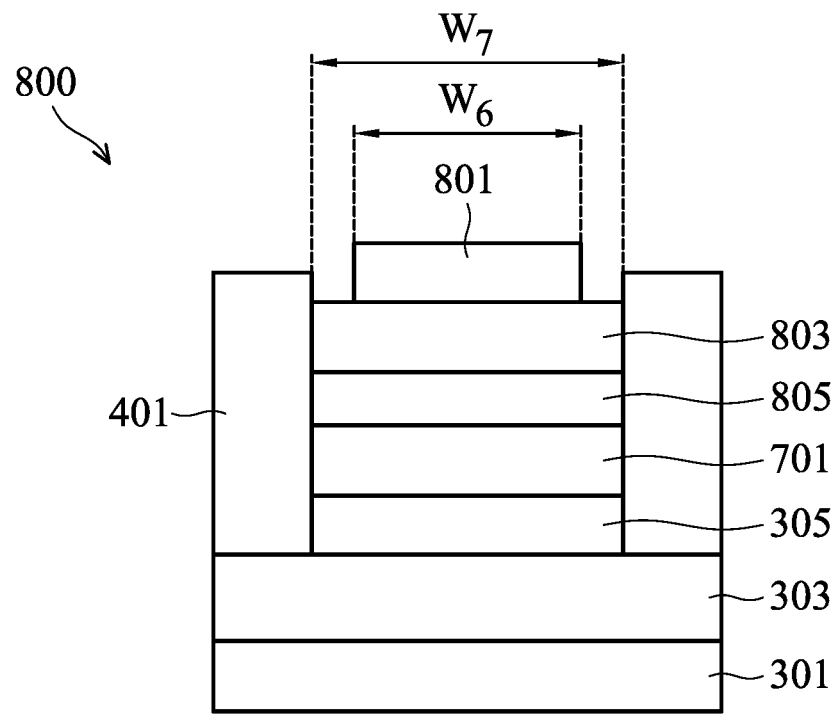
FIGS. 8A-8B illustrate a formation of source/drain regions in accordance with some embodiments.
Figure 8B:
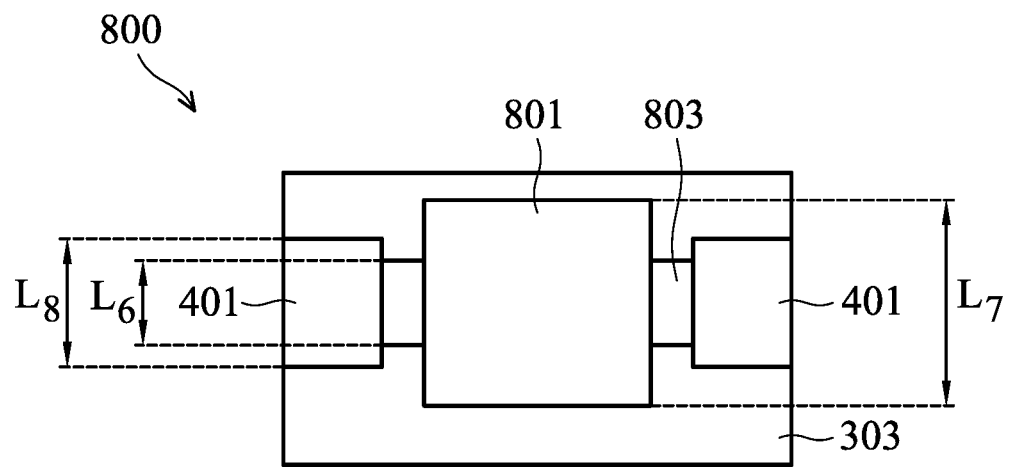

FIGS. 7-8B illustrate another embodiment in which a multiple channel, multiple gate transistor 800 is formed. In this embodiment, the first channel layer 103 is grown over the first gate dielectric 303, which is already formed and located over the first gate electrode 301. For example, the first channel layer 103 is formed to the first thickness $T_1$ (less than the critical thickness $T_c$) such that the first channel layer 103 has the properties of a semiconductor material, such as by being less than 6 quintuple layers in an embodiment in which the first channel layer 103 is $Bi_2Se_3$.

Once the first channel layer 103 has been formed, a first dielectric layer 701 may be formed over the first channel layer 103 in order to separate and isolate the first channel layer 103 (which will become the first channel 305 in the multiple channel, multiple gate transistor 800) from a second channel layer 703 (which will become a second channel 805 in the multiple channel, multiple gate transistor 800). In an embodiment the first dielectric layer 701 may be dielectric material such as aluminum oxide or hafnium oxide that is formed using a process such as ALD, CVD, PVD, combinations of these, or the like. The first dielectric layer 701 may be formed to have an equivalent oxide thickness of between about 0.5 nm and about 2 nm, although any suitable thickness may be utilized.

Once the first dielectric layer 701 has been formed, a second channel layer 703 may be formed on the first dielectric layer 701. In an embodiment the second channel layer 703 will be used to form the second channel 805 of the multiple channel, multiple gate transistor 800 and, as such, may be similar to the first channel layer 103. For example, the second channel layer 703 may be formed from a topological insulator material such as $Bi_2Se_3$ and may be formed to have the first thickness $T_1$ which is below the critical thickness $T_c$ of the material used for the second channel layer 703. As such, the second channel layer 703 will have the properties of a semiconductor material. In a particular embodiment in which $Bi_2Se_3$ is used as the material for the second channel layer 703, the second channel layer 703 may be formed to have the first thickness $T_1$ of less than about six quintuple layers, although any suitable thickness may be utilized.

After the second channel layer 703 has been formed, a second gate dielectric layer 705 is formed over the second channel layer 703. In an embodiment the second gate dielectric layer 705 may be formed from similar materials and using similar processes as the first gate dielectric layer 105 described above with respect to FIG. 1. For example, the second gate dielectric layer 705 may be formed from a dielectric material such as aluminum oxide or hafnium oxide to a thickness of between about 0.5 nm and about 2 nm using a process such as ALD, CVD, PVD, or the like. However, any suitable material or method of manufacturing may be utilized.

Once the second gate dielectric layer 705 has been formed, a second gate electrode layer 707 may be formed over the second gate dielectric layer 705. In an embodiment the second gate electrode layer 707 may be formed from similar materials and using similar processes as the first gate electrode layer 107 described above with respect to FIG. 1. For example, the second gate electrode layer 707 may be formed from a conductive material such as gold, titanium, platinum, aluminum, or the like using a process such as ALD, CVD, PVD, or the like. However, any suitable material or method of manufacturing may be utilized.

FIG. 8A illustrates a formation of the source/drain regions 401. In an embodiment the formation of the source/drain regions 401 may be initiated by first patterning the second gate electrode layer 707 into a second gate electrode 801. In an embodiment the second gate electrode layer 707 is patterned in a similar fashion as the first gate electrode layer 107 was patterned into the first gate electrode 301 (described above with respect to FIG. 3). For example, a photoresist may be placed, exposed, developed, and used as a mask in a photolithographic masking and etching process in order to pattern the second gate electrode layer 707 into the second gate electrode 801. In an embodiment the second gate electrode 801 may be formed to have a sixth width $W_6$ of between about 7 nm and about 100 µm.

Once the second gate electrode 801 has been formed, the second gate dielectric layer 705, the second channel layer 703, the first dielectric layer 701, and the first channel layer 103 may next be patterned for the eventual formation of the source/drain regions 401. In an embodiment the second gate dielectric layer 705, the second channel layer 703, first dielectric layer 701, and the first channel layer 103 may be patterned by initially placing, exposing, and developing a photoresist over the second gate electrode 801 and exposed second gate dielectric layer 705 and then using the photoresist as a mask during an etching process such as a dry etching process in order to etch through the second gate dielectric layer 705, the second channel layer 703, the first dielectric layer 701, and the first channel layer 103 until the first gate dielectric 303 has been exposed. The patterning will form a second gate dielectric 803 (from the second gate dielectric layer 705), a second channel 805 (from the second channel layer 703) and the first channel 305 (from the first channel layer 103). In an embodiment the second gate dielectric 803, the second channel 805 and the first channel 305 may be formed to have a seventh width $W_7$ of between about 7 nm and about 100 µm. although any suitable dimension may be utilized.

Once the underlying first gate dielectric 303 has been exposed, the source/drain regions 401 may be formed on opposite sides of the first channel 305 and the second channel 805, and the source/drain regions 401 may be formed as described above with respect to FIG. 4A. For example, the source/drain regions 401 may be formed from the same material as the first channel 305 and the second channel 805 and using an epitaxial growth process to epitaxially grow the source/drain regions 401 onto the exposed first gate dielectric 303. Additionally, the source/drain regions 401, while being grown from the same material as the first channel 305 and the second channel 805, will grow the source/drain regions 401 to have the second thickness $T_2$ that is at least greater than the critical thickness $T_c$ of the material used for the source/drain regions 401 such that the source/drain regions 401 will have the properties of a topological insulator with metallic surface states. For example, in an embodiment in which $Bi_2Se_3$ is used as the material for the source/drain regions 401, the source/drain regions 401 may be grown to the second thickness $T_2$ that is greater than six quintuple layers. However, any suitable thickness may be utilized.

FIG. 8B illustrates a top down view of the multiple channel, multiple gate transistor 800. In this embodiment the second gate dielectric 803 may be formed to have a sixth length $L_6$ of between about 7 nm and about 100 µm. while the second gate electrode 801 may be formed to have a seventh length $L_7$ of between about 7 nm and about 100 µm. Additionally, the source/drain regions 401 may be formed to have an eighth length $L_8$ of between about 7 nm and about 100 µm. However, any suitable dimensions may be utilized.

By utilizing the processes described above with respect to FIGS. 7-8B, a multiple channel, multiple gate transistor 800 may be formed. Such a transistor allows for a normally off transistor with the use of topological materials which also has the benefits that multiple channels and multiple gates provide.

In accordance with an embodiment, a method of manufacturing a semiconductor device comprising growing a layer of a first material to a first thickness onto a substrate, the first thickness being less than a critical thickness is provided. A gate dielectric layer and a gate electrode layer are deposited over the layer of the first material and the gate dielectric layer and the gate electrode layer are patterned into a gate stack. The first layer of material is patterned to expose a portion of the substrate, and source/drain regions are grown onto the portion of the substrate, wherein the growing the source/drain regions grows the first material to a thickness greater than the critical thickness.

In accordance with another embodiment, a method of manufacturing a semiconductor device comprising growing a layer of a first material to a first thickness onto a substrate, the first thickness being greater than a critical thickness, is provided. A portion of the first material is removed to form a channel region and an opening over the channel region, wherein the removing the portion of the first material reduces the thickness of at least a portion of the first material to less than the critical thickness and also modifies the properties of the first material within the channel region. A gate dielectric is formed within the opening, and a gate electrode is formed over the gate dielectric.

In accordance with yet another embodiment, a semiconductor device comprising a first channel region comprising a first material, wherein the first material has a critical thickness below which the first material has properties of a semiconductor material and above which the first material has properties of a topological insulator, wherein the first channel region has a first thickness less than the critical thickness is provided. A source/drain region is adjacent to the first channel region, wherein the source/drain region comprises the first material with a second thickness greater than the critical thickness. A gate dielectric is adjacent to the first channel region, and a gate electrode is on an opposite side of the gate dielectric from the first channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
  a first material on a top surface of a substrate with a channel region and a source/drain region, the channel region having a first thickness less than a critical thickness below which the first material has properties of a semiconductor material and above which the first material has properties of a topological insulator, the source/drain region being adjacent to the channel region and having a second thickness greater than the critical thickness, wherein the first thickness and the second thickness are defined along a direction perpendicular to the top surface of the substrate;
  a gate dielectric adjacent to the channel region; and
  a gate electrode adjacent to the gate dielectric.

2. The semiconductor device of claim 1, wherein the first material is $Bi_2Te_3$.

3. The semiconductor device of claim 1, wherein the first material is $Sb_2Te_3$.

4. The semiconductor device of claim 1, wherein the first material is $Bi_2Te_2Se$.

5. The semiconductor device of claim 4, wherein the first material is $Bi_2Te_2S$.

6. The semiconductor device of claim 1, wherein the first material is $Bi_2Se_2S$.

7. The semiconductor device of claim 1, wherein the first material is $Sb_2Te_2Se$.

8. A semiconductor device comprising:
  a first material with a critical thickness below which the first material has properties of a semiconductor material and above which the first material has properties of a topological insulator;
  a gate dielectric extending between and directly contacting a first thickness of the first material and a second thickness of the first material, the first thickness less than the critical thickness and the second thickness greater than the critical thickness; and
  a gate electrode adjacent to the gate dielectric.

9. The semiconductor device of claim 8, wherein the first thickness is less than six quintuple layers.

10. The semiconductor device of claim 8, further comprising a second material with a second critical thickness below which the second material has properties of a second semiconductor material and above which the second material has properties of a second topological insulator, the second material being located over the first material.

11. The semiconductor device of claim 8, wherein the first material is $Sb_2Te_2Se$.

12. The semiconductor device of claim 8, wherein the first material is $Bi_2Se_2S$.

13. The semiconductor device of claim 8, wherein the first material is $Bi_2Te_2S$.

14. The semiconductor device of claim 8, wherein the first material is $Bi_2Te_2Se$.

15. A semiconductor device comprising:
  a first semiconductor region extending between a first topological insulator and a second topological insulator, wherein the first semiconductor region, the first topological insulator, and the second topological insulator are the same material, each with a different thickness;
  a gate dielectric overlying the first semiconductor region, wherein a portion of the gate dielectric extends between and directly contacts the first topological insulator and the second topological insulator; and
  a gate electrode overlying the gate dielectric.

16. The semiconductor device of claim 15, wherein first semiconductor region is an epitaxial material.

17. The semiconductor device of claim 15, wherein the same material is $Bi_2Se_3$.

18. The semiconductor device of claim 15, wherein the first semiconductor region is less than six quintuple layers.

19. The semiconductor device of claim 15, wherein the first semiconductor region is part of a multiple channel transistor.

20. The semiconductor device of claim 15, further comprising a second semiconductor region extending between the first topological insulator and the second topological insulator, the second semiconductor region being separated from the first semiconductor region by a dielectric material.

\* \* \* \* \*